United States Patent [19]

Nakano

[11] Patent Number: 5,194,864
[45] Date of Patent: Mar. 16, 1993

[54] VECTOR QUANTIZATION METHOD AND APPARATUS

[75] Inventor: Keiichi Nakano, Hachioji, Japan

[73] Assignee: Olympus Optical Co., Ltd., Tokyo, Japan

[21] Appl. No.: 770,987

[22] Filed: Oct. 1, 1991

[30] Foreign Application Priority Data

Oct. 3, 1990 [JP] Japan ............................... 2-267000
Oct. 19, 1990 [JP] Japan ............................... 2-280988
Jun. 27, 1991 [JP] Japan ............................... 3-156815

[51] Int. Cl.$^5$ ............................................. H03M 7/00
[52] U.S. Cl. ............................................. 341/106; 358/133
[58] Field of Search ....................... 341/106, 51, 65, 67, 341/155, 200; 358/133, 261.2, 136, 12; 381/41, 42

[56] References Cited

U.S. PATENT DOCUMENTS 4,326,259  4/1982  Cooper et al. .
4,727,354  2/1988  Lindsay .
5,010,574  4/1991  Wang ...................................... 395/2

OTHER PUBLICATIONS

Article entitled "Learning Representations by Back-Propagating Errors" by David E. Rumelhart, et al., published in Nature, vol. 323-9 pp. 533-536, 1986, (p. 533 enclosed only).

Primary Examiner—A. D. Pellinen
Assistant Examiner—Brian K. Young
Attorney, Agent, or Firm—Frishauf, Holtz, Goodman & Woodward

[57] ABSTRACT

In a vector quantization method and apparatus of the invention, in the network learning step, learning is performed such that output units corresponding to the indexes of a plurality of code book vectors Yi are caused to ignite more as the output units are located nearer to an input vector. The search order is determined such that the code book vectors are searched in the order of the indexes corresponding to the decreasing magnitudes of ignition from the output units. In the strain calculation step, the strains between the code book vectors Yi selected in the determined order and the input vector X are calculated in units of dimensions. The current partial sum of strains is compared with the minimum stain. If the partial sum is larger than the minimum strain, the subsequent strain calculation is interrupted.

14 Claims, 12 Drawing Sheets

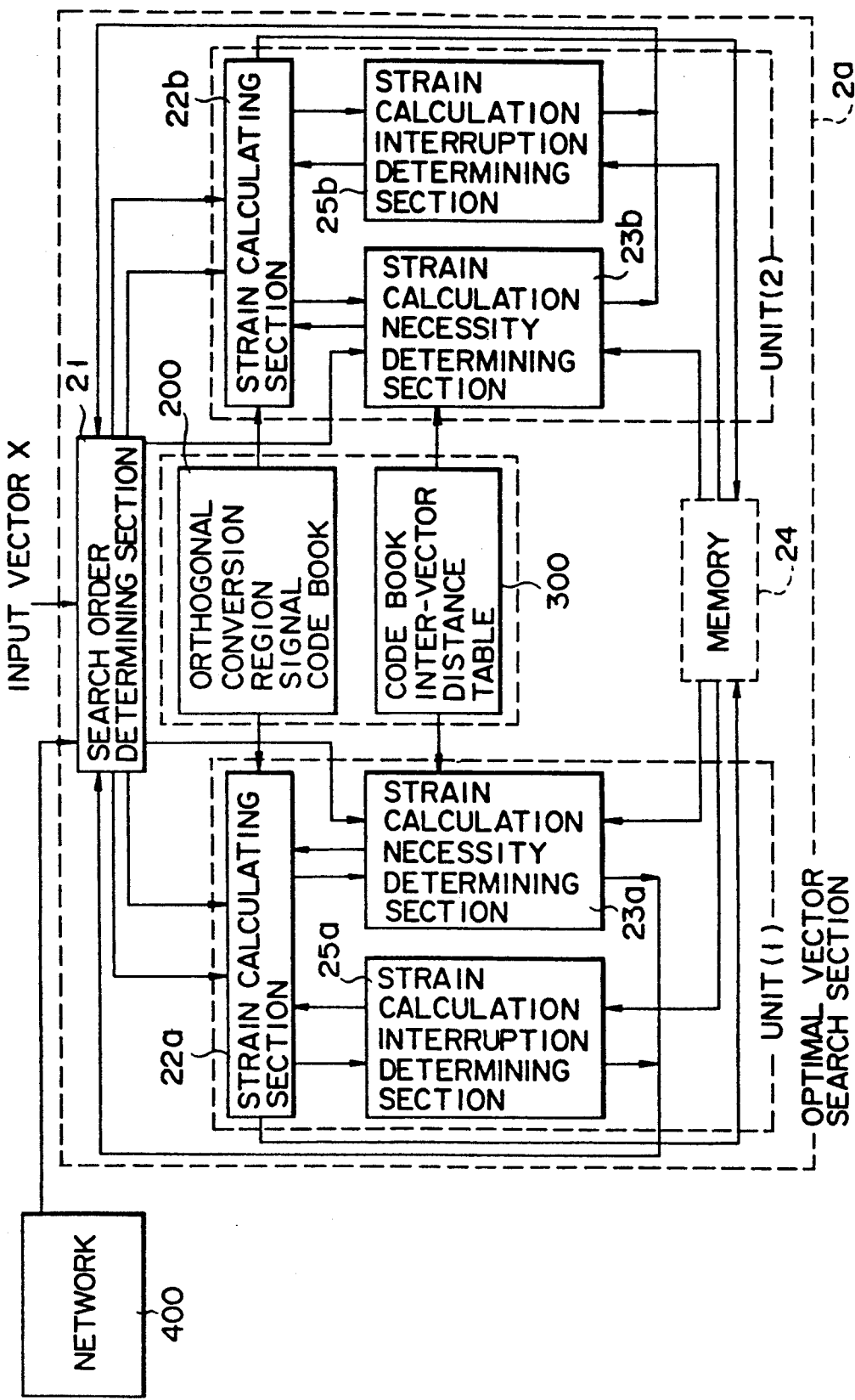
F I G. 4

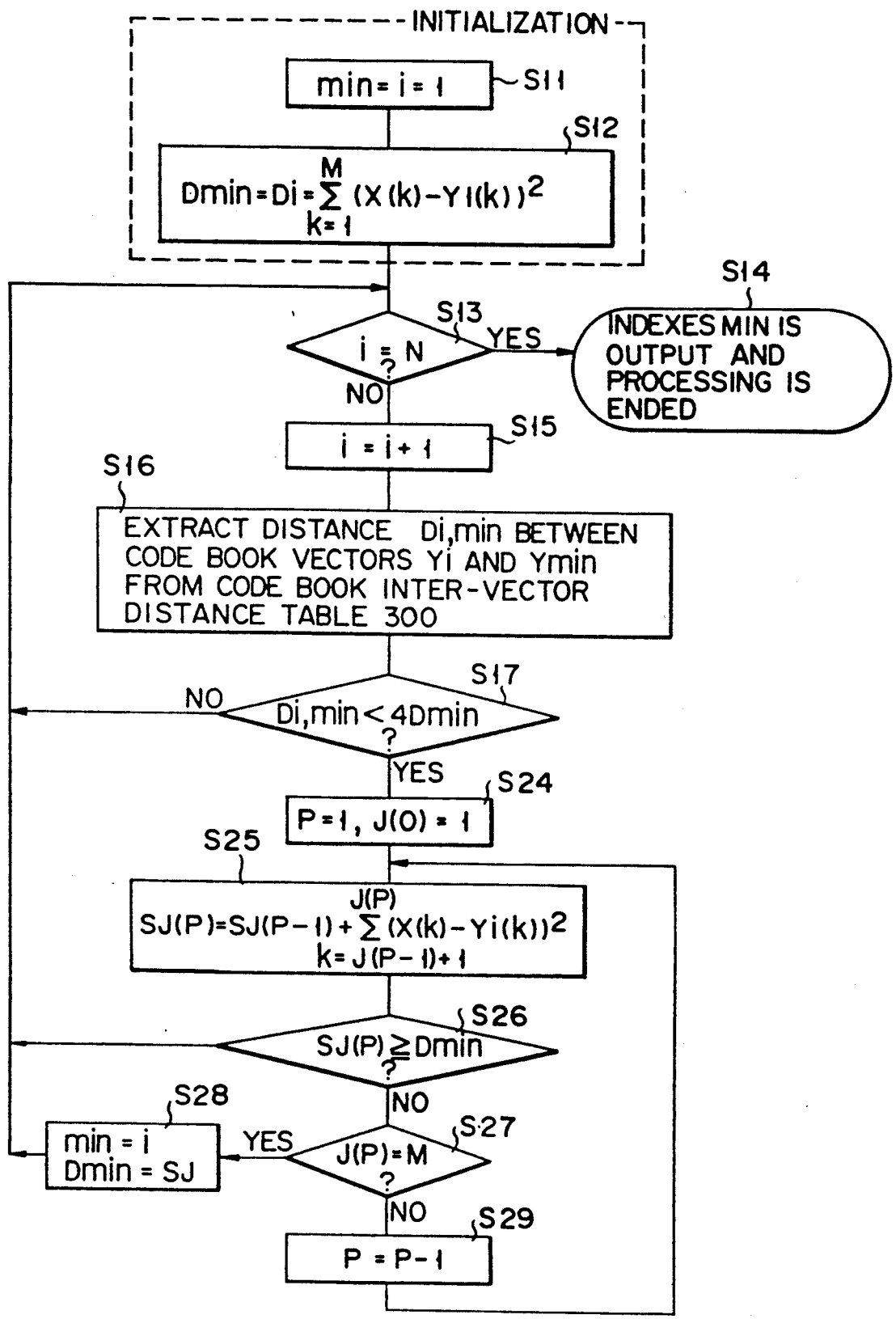
F I G. 6

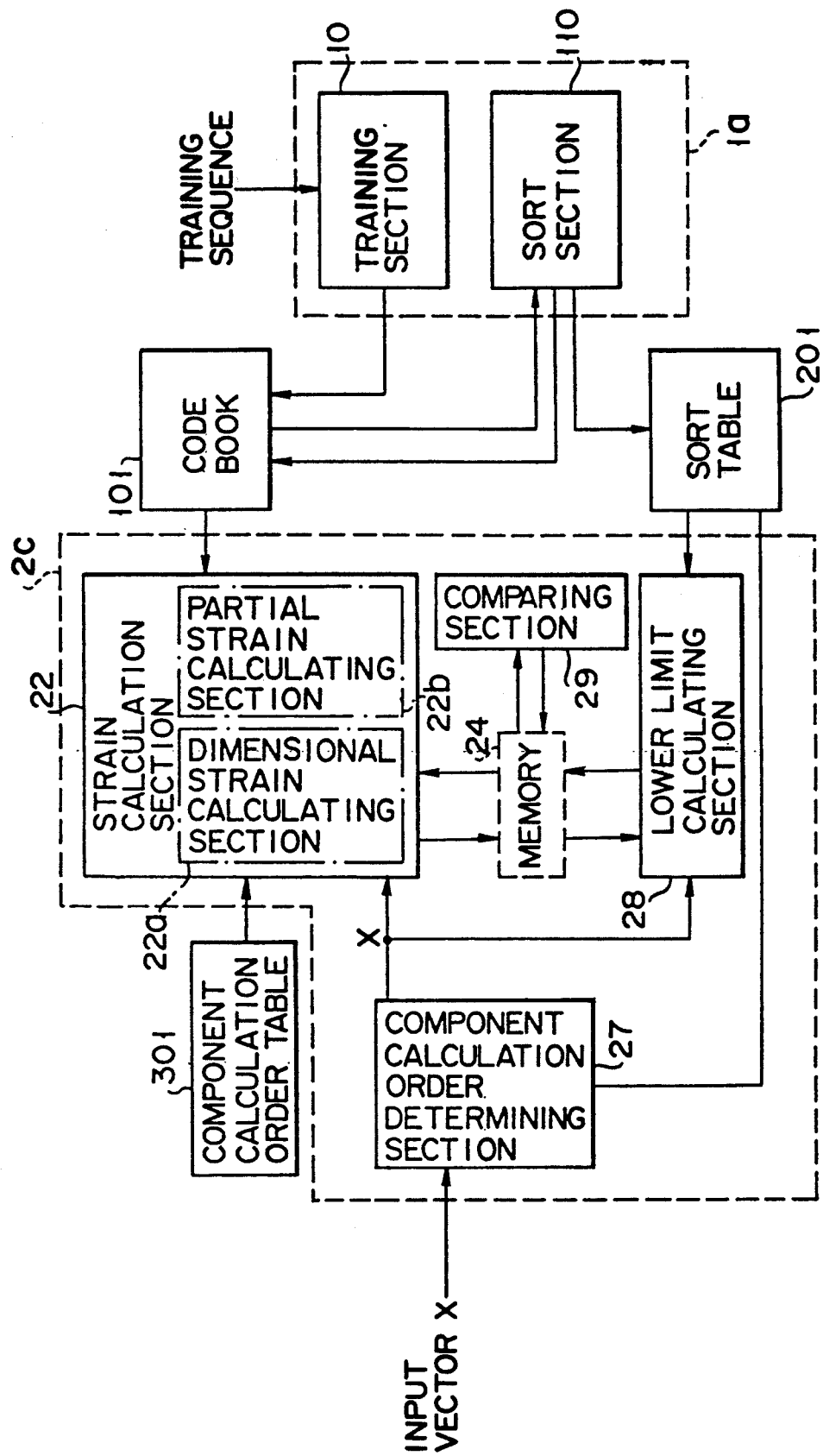
F I G. 7

| NO. | DIMENSION | 1 | 2 | 3 | ... | k | ... | M |
|---|---|---|---|---|---|---|---|---|
| 1 | VALUE | Y1(1) | Y1(2) | Y1(3) | ... | Y1(k) | ... | Y1(M) |
| | BASE VALUE NUMBER | 3 | 7 | M | ... | 54 | ... | 23 |
| 2 | VALUE | Y2(1) | Y2(2) | Y2(3) | ... | Y2(k) | ... | Y2(M) |
| | BASE VALUE NUMBER | 59 | 1 | 21 | ... | 33 | ... | 6 |
| ... | | ... | ... | ... | | ... | | ... |
| i | VALUE | Yi(1) | Yi(2) | Yi(3) | ... | Yi(k) | ... | Yi(M) |
| | BASE VALUE NUMBER | 11 | 43 | 58 | ... | M | ... | 1 |
| ... | | | | | | | | |
| N | VALUE | YN(1) | YN(2) | YN(3) | ... | YN(k) | ... | YN(M) |
| | BASE VALUE NUMBER | 9 | 10 | 51 | ... | 29 | ... | 17 |

F I G. 8A

| DIMEN-SIONAL NUMBER | | 1 | 2 | 3 | ... | t | ... | AVERAGE VALUE |
|---|---|---|---|---|---|---|---|---|
| 1 | BASE VALUE | V1(1) | V1(2) | V1(3) | ... | V1(t) | ... | Ave 1 |
|   | NUMBER OF VECTORS | 2 | 1 | 1 | ... | 2 | ... | |
| 2 | BASE VALUE | V2(1) | V2(2) | V2(3) | ... | V2(t) | ... | Ave 2 |
|   | NUMBER OF VECTORS | 1 | 1 | 3 | ... | 1 | ... | |
| ... | | ... | ... | ... | ... | ... | ... | ... |
| k | BASE VALUE | Vk(1) | Vk(2) | Vk(3) | ... | Vk(t) | ... | Ave k |
|   | NUMBER OF VECTORS | 2 | 3 | 1 | ... | 1 | ... | |
| ... | | ... | ... | ... | ... | ... | ... | ... |
| M | BASE VALUE | VM(1) | VM(2) | VM(3) | ... | VM(t) | ... | Ave M |
|   | NUMBER OF VECTORS | 1 | 1 | 1 | ... | 1 | ... | |

$Vk(1) < Vk(2) < Vk(3) < \ldots < Vk(t) < \ldots$ $(K = 1 \sim M)$

FIG. 8B

VECTOR QUANTIZATION METHOD AND APPARATUS

BACKGROUND OF THE INVENTION

1. Field of the Invention

The present invention relates to a digital information processing technique and, more particularly, to a vector quantization method and a vector quantization apparatus therefor.

2. Description of the Related Art

When, for example, images or speech sounds are expressed as functions, quantization generally means discretization in a specific value range. That is, quantization means that continuous functions, on sampling points, obtained by sampling, are expressed by a finite number of values. As a practical quantization method, a vector quantization method is available.

In this vector quantization method, for example, an input image is divided into a plurality of blocks, and quantization is performed with respect to one vector constituted by pixels of each block as components. For example, in a specific block, several representative patterns (representative vectors) which are considered to have high frequencies of occurrence are determined, and identification codes are respectively assigned thereto. These representative patterns are stored in an encoder, which is called a code book. Upon reception of an input signal, the code book is searched in units of blocks to find a representative vector most similar to the pattern of the input signal, and the corresponding identification code is output. Such a method is equally applied to speech and the like.

In order to realize high-speed processing, a vector quantization apparatus for executing such vector quantization uses, for example, a tree search method (A. Buzo, A. H. Gray. Jr., R. M. Gray, and J. D. Markel, "Speech coding based upon vector quantization", IEEE Trans. Acoust., Speech & Signal Process., ASSP-28, 10, pp. 562-574, October, 1980), in which a structural code book is used to reduce the number of vectors to be searched.

In addition, as methods of reducing the number of strain (i.e., distance) calculations used for vector quantization, a method of changing the order of search in accordance with the probabilities of occurrence of vectors, and a method of using an intra-vector mean value to interrupt a search have been proposed. With these methods, high-speed vector quantization has been realized.

Of the vector quantization methods described above, the tree search method allows high-speed processing in strain calculations as compared with other methods. However, in this method, if an input vector is present near the boundary between subspaces, an optimal vector cannot be obtained from a code book. Therefore, the tree search method lacks accuracy in terms of the minimization of strain.

In the method of reducing the number of strain calculations, comparison or some processing must be performed with respect to all code book vectors at least once for each.

In the method of performing a search in an order preset in accordance with the probabilities of occurrence of vectors, if the probabilities of vectors are different from those in a code book, it takes much time to reach an optimal vector located at a position near the end. This may cause a great deterioration in efficiency of strain calculations.

In the method of using an intra-vector mean value as a search interruption condition, if vectors having similar characteristics concentrate in a small distribution range, the difference between intra-vector mean values is reduced. If the difference becomes smaller than a preset value, the condition cannot be satisfied, and a search interruption may be not determined.

In the above-described conventional search methods, an optimal, efficient, high-speed search for a code book vector corresponding to an input vector cannot be performed depending on the characteristics of the input vector.

SUMMARY OF THE INVENTION

It is an object of the present invention to provide a vector quantization method and apparatus which can efficiently search out an optimal code book vector at high speed with a small number of calculations regardless of the type of an input vector.

According to the present invention, there is provided a vector quantization method comprising the steps of performing network learning such that output units (corresponding to indexes of a plurality of code book vectors Yi) are caused to ignite more as the output units are located nearer to an input vector, determining a search order such that the code book vectors are sequentially searched in the order of the indexes corresponding to the decreasing magnitudes of ignition from the output units, calculating strains (i.e., distances) between the code book vectors Yi selected in the determined order and the input vector X in units of dimensions, comparing a current partial sum of strains with a minimum strain i.e., sum of distances), and interrupting the subsequent strain calculation when the partial sum is larger than the minimum strain (i.e., minimum distance).

In addition, there is provided a vector quantization apparatus comprising network means which has undergone the learning, search order determining means for performing the search operation, strain calculating means for performing the strain calculation, comparing means for comparing the partial sum with the minimum strain, and strain calculation interrupting means for interrupting the subsequent strain calculation when the partial sum becomes larger than the minimum strain.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above an the detailed description of the preferred embodiments given below, serve to explain the principles of the invention.

FIG. 4 is a block diagram showing the arrangement of a vector quantization apparatus according to the second embodiment of the present invention;

FIG. 6 is a flow chart showing a procedure for searching for an optimal code book vector in the vector quantization apparatus of the third embodiment;

FIG. 7 is a block diagram showing the arrangement of a high-speed vector quantization apparatus according to the fourth embodiment of the present invention;

FIG. 8 is a view showing a code book, FIG. 8B is a view showing a sort table.

DETAILED DESCRIPTION OF THE PREFERRED EMBODIMENTS

Embodiments of the present invention will be described below with reference to the accompanying drawings.

Figure 1:
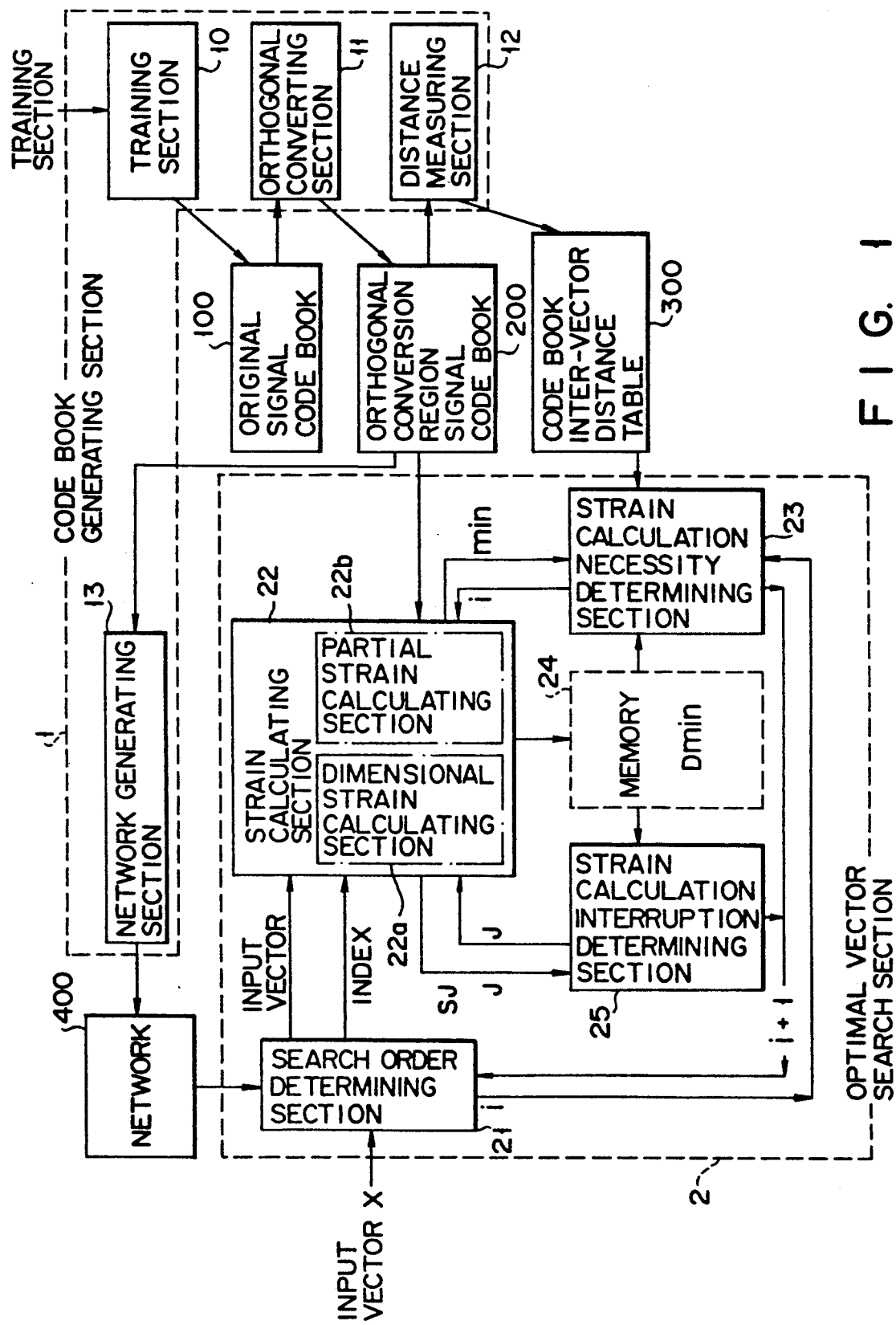
FIG. 1 is a block diagram showing the arrangement a high-speed vector quantization apparatus according to the first embodiment of the present invention.

FIG. 1 is a block diagram showing the arrangement of a high-speed vector quantization apparatus according to the first embodiment of the present invention. This arrangement is roughly divided into a code book generating section 1 and an optimal vector search section 2.

In the code book generating section 1, an original signal code book 100 is generated by a training section 10 in accordance with a provided training sequence.

An orthogonal converting section 11 generates an orthogonal conversion region signal code book 200 by performing orthogonal conversion of the generated original signal code book 100. A distance calculating section 12 calculates the distances between code book vectors by using the orthogonal conversion region signal code book 200 to generate a code book inter-vector distance table 300. In the distance calculating section 12, the code book inter-vector distance table 300, i.e., a code book inter-vector distance $D_{i,j}$ is calculated according to the following equation:

$$D_{i,j} = \sum_{k=1}^{M} (Y_i(k) - Y_j(k))^2 \quad (1)$$

for $i,j = 1 \sim N; i > j$
where N is the number of code book vectors, M is the dimension (element) of a vector, and Yi is the code book vector indicated by an index i.

A network generating section 13 generates a network 400 which receives a vector from the orthogonal conversion region signal code book 200 and outputs an index corresponding to the input vector. In this case, assume that the original signal code book 100 is a code book used on the decoder side, and a code book described below is the orthogonal conversion region signal code book 200.

The arrangement of the optimal vector search section 2 will be described below.

Upon reception of an input vector X from the outside, a search order determining section 21 determines a search order with respect to the code book 200 by using the network 400. The input vector X and an index corresponding to the input vector X are supplied from the search order determining section 21 to a strain calculating section 22. The strain calculating section 22 is constituted by a dimensional strain calculating section 22a for calculating the strains between the input vector X and code book vectors in units of dimensions, and a partial strain calculating section 22b for calculating the partial sum of the strains.

The following components are connected to the strain calculating section 22: a strain calculating necessity determining section 23 for determining necessity for strain calculation by using the code book inter-vector distance table 300; a memory 24 for storing the minimum strain amount; and a strain calculation interruption determining section 25 for determining strain calculation interruption by comparing the partial sum of strains in the respective dimensions with a latest minimum strain amount. In addition, the memory 24 supplies a stored latest minimum amount to the strain calculation necessity determining section 23 and the strain calculation interruption determining section 25, as needed.

An arrangement and a procedure for generating a network according to the first embodiment will be described below with reference to the arrangement of the network in FIG. 2A and the flow chart in FIG. 2B.

In the network generating section 13, a learning operation is performed by, e.g., the back-propagation method (D. E. Rumelhart, G. E. Hinton, and R. J. Williams: Learning representations by back-propagating errors, Nature, Vol. 323-9, pp. 533-536, 1986) in accordance with the procedure shown in FIG. 2B, and a network 400 corresponding to a code book having the structure shown in FIG. 2A is generated.

Figure 2A:
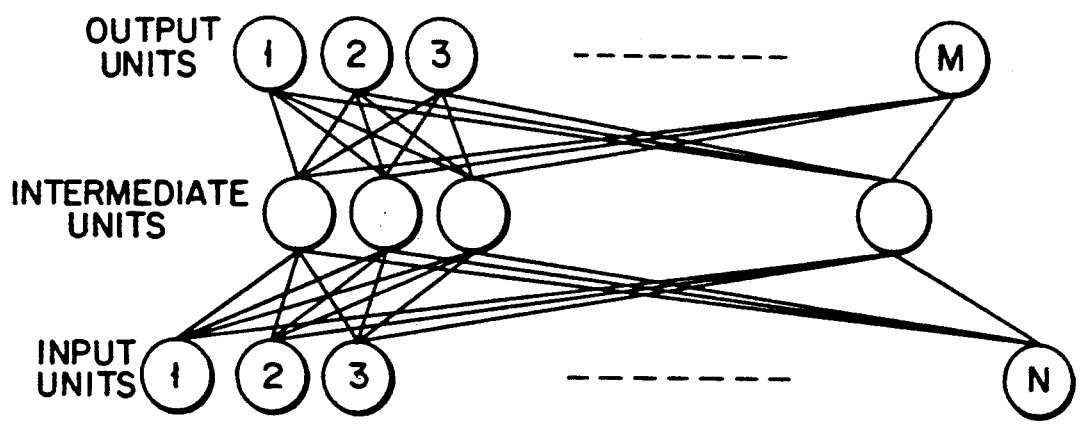
FIG. 2 is a view showing the arrangement of a network.
FIG. 2B is a flow chart showing a procedure for generating a network.
Figure 2B:
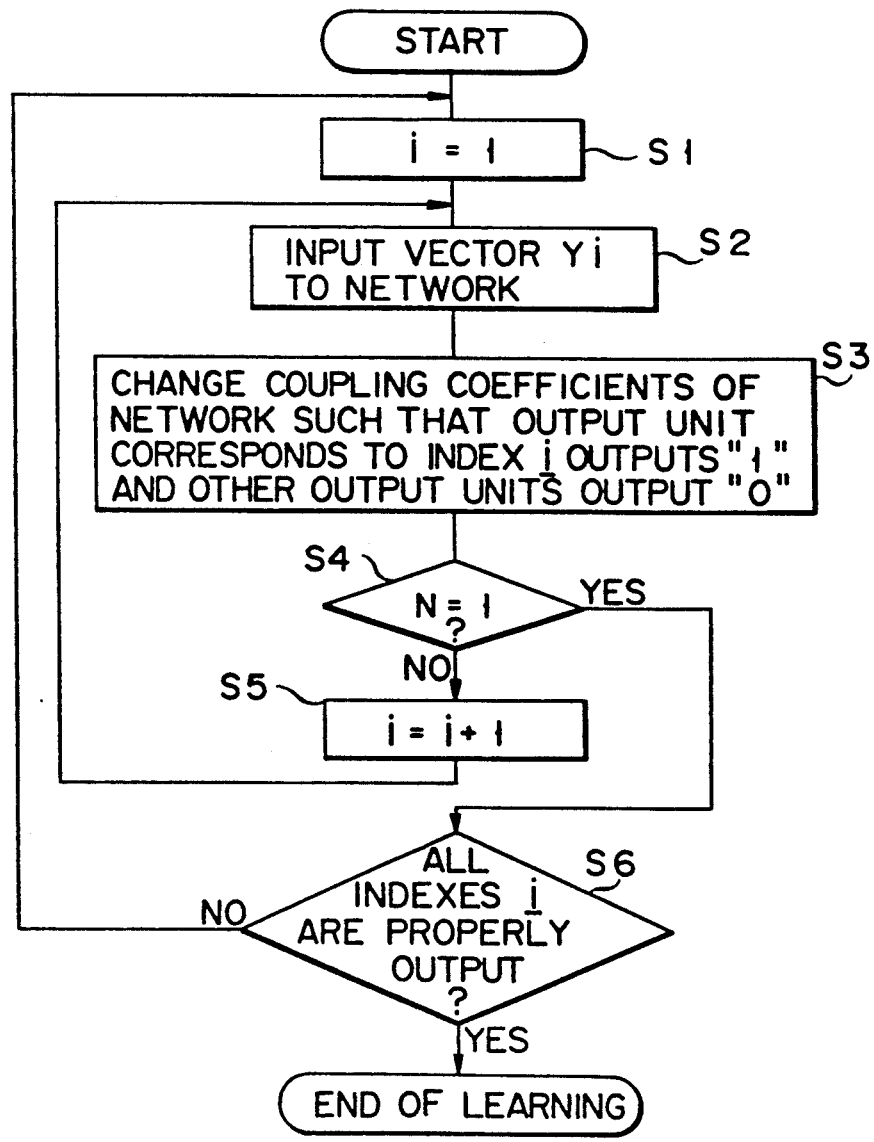

As shown in FIG. 2A, the network 400 comprises three layers, i.e., an input layer constituted by a plurality of input units for respectively receiving input vectors, an intermediate layer constituted by a plurality of intermediate units, each connected to all the input units, and a plurality of output layers (units), each connected to all the intermediate units.

These units are coupled to each other to form a simple hierarchical structure in which one code book vector corresponds to one output unit. In addition to this hierarchical structure, other types of hierarchical structures, such as the structure of a neural network, in which the respective units in each layer are coupled to each other, may be used.

A method of generating a network will be described below with reference to the flow chart in FIG. 2B.

An index i is initialized to be "1" (step S1). A code book vector Yi is then input to a network which is not set yet (step S2). The coupling coefficient of the network is changed such that one output unit corresponding to the input index i outputs "1", and the remaining output units output "0" (step S3).

It is checked whether the processing between the index i="1" and the index i="N" is completed (step S4). In this case, if the index i is less than N (NO in step S4), "1" is added to the index i (step S5), and the flow returns to step S2. If the index i=N (YES in step S4), it is checked whether each of the input indexes i is output in correspondence with a corresponding one of the output units, and identical indexes i are always output to the same output unit (step S6). If the indexes i and the output units do not have one-to-one correspondence, e.g., if the index i is output to different output units (NO in step S6), the flow returns to step S1. If it is determined that all the indexes i are properly output (YES in step S6), it is considered that learning is completed, and this network forming process is ended.

Figure 3:
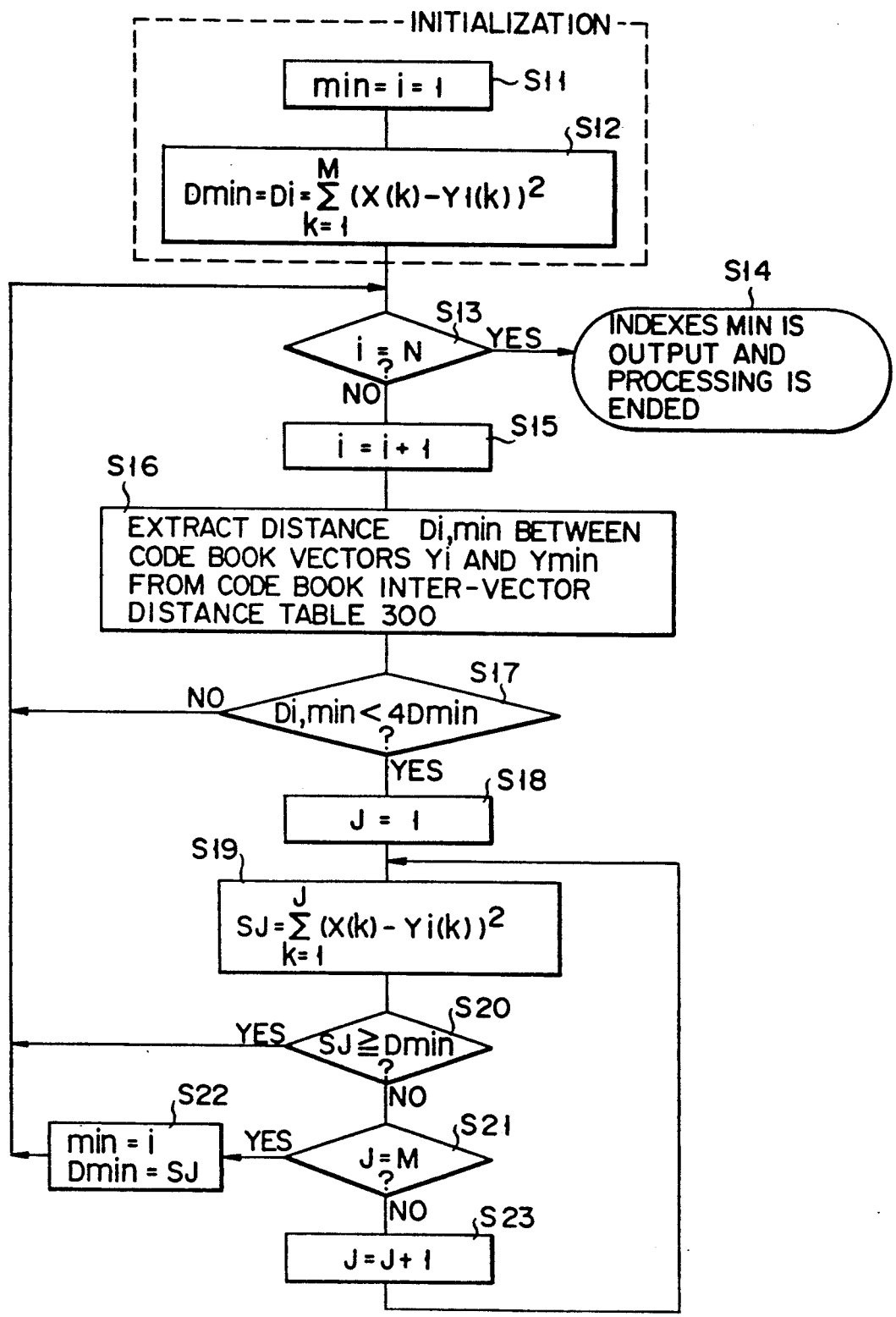
FIG. 3 is a flow chart showing a procedure for searching for an optimal code book vector.

The optimal vector search section 2 as an encoding section searches for an optimal code book vector in accordance with the flow chart shown in FIG. 3. This procedure will be described below with reference to the components shown in FIG. 1.

Initialization is performed first. In this initialization, upon reception of the input vector X, the search order determining section 21 rearranges the order of searching indexes by using the network 400, which has undergone learning, such that a search operation is performed in the order of decreasing ignition amounts (output amounts) of the output units. That is, the search order is rearranged in such a manner that the index i of a vector which provides the maximum output is set to be "1" (step S11), and the index i of a vector which provides the minimum output is set to be "N".

Upon reception of the input vector X and an index 1 indicating a code book vector which ignites most, the strain calculating section 22 extracts a code book vector Y1 from the code book 200, and calculates the strain between the code book vector Y1 and the input vector X according to equation (1) described above (step S12).

After the sum of strains in all the dimensions is stored, as a value $D_{min}$, in the memory, an index min indicating a code book vector which provides the minimum strain is set to be "1" and is supplied to the strain calculating necessity determining section 23. With the operations described above, the initialization is completed.

It is then checked whether the processing up to the index i="N" is completed (step S13). If the processing up to the index i="N" is completed (YES in step S13), the previous index min is output to the memory, and a search for an optimal code book vector is ended (step S14). If the processing up to the index i="N" is not completed (NO in step S13), "1" is added to the index i of step S13 (step S15).

The search order determining section 21 supplies the index i indicating a code book vector subjected to the next search operation to the strain calculation necessity determining section 23. The strain calculation necessity determining section 23 extracts an intervector distance $D_{i,min}$ corresponding to the index i and the index min from the code book inter-vector distance determining section 300 (step S16), and compares the inter-vector distance $D_{i,min}$ with the inter-vector distance $D_{min}$ stored in the memory (step S17). If the following inequality is not satisfied:

$$D_{i,min} < 4D_{min} \qquad (2)$$

then it is determined that no strain calculation is necessary (NO in step S17), and an index i+1 corresponding to the next code book vector is supplied to the search order determining section 21, thus setting the next target code book vector. If it is determined that strain calculation is necessary (YES in step S17), the index i is supplied to the strain calculating section 22.

Subsequently, J of the Jth-degree component is set to be "1" (step S18). Thereafter, the strain calculating section 22 extracts the code book vector Yi from the code book 200 by using the index i, and calculates the strain between the code book vector Yi and the input vector X (step S19). In this case, the strain calculating section 22 obtains a partial sum $S_J$ of strains from a low-degree component to the Jth-degree component according to the following equation:

$$S_J = \sum_{k=1}^{J} (X(k) - Y(k))^2 \qquad (3)$$

for (J=1~M)

The obtained partial sum $S_J$ is supplied to the strain calculation interruption determining section 25. The strain calculating interruption determining section 25 compares the partial sum $S_J$ with the inter-vector distance $D_{min}$ stored in the memory (step S20). When the following inequality for comparison is satisfied:

$$S_J > D_{min} \qquad (4)$$

the subsequent strain calculation is interrupted. If the strain calculation is interrupted (YES in step S20), the index i+1 corresponding to the next code book vector is supplied to the search order determining section 21, thus setting the next target code book vector.

If the strain calculation is not interrupted (NO in step S20), the degree J of the vector is incremented and supplied to the strain calculating section 22.

Subsequently, it is checked whether the degree J of the vector is equal to a vector dimension M (step S21). If the degree J of the vector is equal to the vector dimension M (YES in step S21), the partial sum $S_J$ of the strains is stored, as a new minimum strain $D_{min}$, in the memory, and the new index min is supplied to the strain calculation necessity determining section 23 (to step S13) (step S22).

If the degree J of the vector is less than the vector dimension M (NO in step S21), "1" is added to the degree J of the vector (step S23), and the flow returns to step S19 to calculate the next partial sum $S_J$ of strains.

The above-described operation is performed with respect to all the code book vectors in the same procedure as described above, thus searching for an optimal code book vector.

In the above-described first embodiment, a code book vector closest to an input vector is selected first by the network regardless of the distribution of code book vectors, and hence strain calculation can be started from the code book vector closest to the input vector. Strain calculation, therefore, need not be performed with respect to most of the remaining code book vectors which are not selected, or strain calculation can be interrupted upon a small number of calculations. With this operation, an optimal code book vector corresponding to an input vector can be efficiently searched out with a small number of calculations in spite of the fact that all the code book vectors of a code book are subjected to a search operation.

FIG. 4 shows the arrangement of a vector quantization apparatus according to the second embodiment of the present invention. The vector quantization apparatus of the second embodiment has an arrangement similar to that of the apparatus of the first embodiment. FIG. 4 shows an optimal vector search section 2a as a characteristic feature. Therefore, the vector quantization apparatus of the second embodiment is roughly divided into a code book generating section 1 (not shown) and an optimal vector search section 2a.

The same reference numerals in the second embodiment denote the same parts as in the first embodiment, and a description thereof will be omitted.

The optimal vector search section 2a is constituted by units 1 and 2 which share a memory 24 for storing the minimum strain amount and respectively comprise strain calculating sections 22a and 22b, strain calculation necessity determining sections 23a and 23b, and strain calculation interruption determining sections 25a and 25b.

An operation of the vector quantization apparatus having such an arrangement will be described next.

In the optimal vector search section 2a, initialization is performed in the same manner as in the first embodiment. This initialization can be performed by one of the strain calculating sections 22a and 22b, or can be performed by both the sections 22a and 22b in parallel by arranging an information transfer means therebetween. Subsequently, a search operation in the unit 1 is performed in the order of increasing indexes (in this case, starting from an index i=2), and a search operation in the unit 2 is performed in the order of decreasing indexes (in this case, starting from the index i=N), i.e., the reverse order to that in the unit 1, thus performing parallel processing in accordance with the flow chart shown in FIG. 3.

According to the second embodiment described above, therefore, since the processing for the whole code book vectors can be shared between the two units by using the strain between a input vector and a code book vector closest to the input vector, a high-speed search operation can be realized. Even if an optimal search order is not set, a search operation can be executed from the opposite directions, and a high-speed search operation can be realized.

Figure 5:
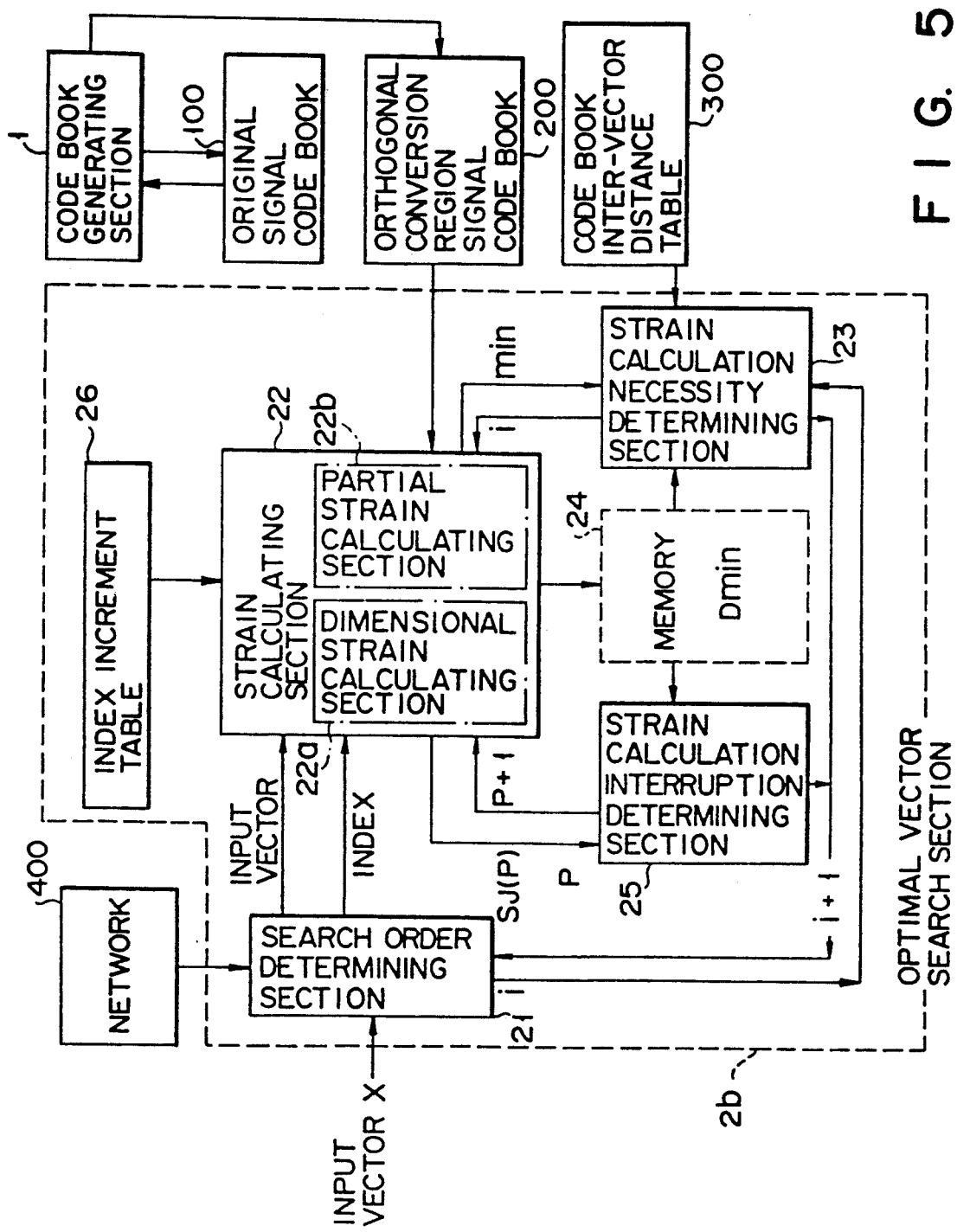
FIG. 5 is a block diagram showing the arrangement of a vector quantization apparatus according to the third embodiment of the present invention.

FIG. 5 is a block diagram showing the arrangement of a vector quantization apparatus according to the third embodiment of the present invention. Similar to the second embodiment, the arrangement of this apparatus can be roughly divided into a code book generating section 1 and an optimal vector search section 2b. The arrangement of the optimal vector search section 2b will be described below. In said code book generating section 1, said original signal code book 100 is generated by a given training section, in the same way as shown in FIG. 1.

Upon reception of an input vector X from the outside, a search order determining section 21 determines a search order with respect to a code book 200 by using a network 400. The input vector X and a corresponding index are supplied from the search order determining section 21 to a strain calculating section 22. The strain calculation section 22 is constituted by a dimensional strain calculating section 22a for calculating the strains between the input vector x and code book vectors in units of dimensions, and a partial strain calculating section 22b for calculating the partial sum of the strains.

The calculating section 22 comprises a strain calculation necessity determining section 23 for determining necessity for strain calculation by using a code book inter-vector distance table 300, a memory 24 for storing the minimum strain amount, a strain calculation interruption determining section 25 for determining strain calculation interruption by comparing the partial sum of strains in the respective dimensions with a latest minimum strain amount, and an index increment table 26 for indicating an index for which the next strain calculation interruption determination is to be executed.

In addition, the memory 24 supplies a stored latest minimum amount to the strain calculation necessity determining section 23 and the strain calculation interruption determining section 25, as needed.

In the first and second embodiments described above, whether to interrupt strain calculation is determined by comparing the partial sum of strains with the current minimum strain every time the strain in each dimension is added to the partial sum. For this reason, while the number of dimensions, strains in which are added to the partial sum is added to the partial sum of strains, is small, the partial sum is often much smaller than the minimum strain. In this case, a processing time is wasted on comparison processing. In the third embodiment, therefore, the partial sum of strains is compared with the current minimum strain when the strains in a certain number of dimensions are collectively added to the partial sum.

An operation of the vector quantization apparatus having such an arrangement will be described below.

A latest vector search section 2a as an encoding section searches for an optimal code book vector in accordance with a procedure in the flow chart shown in FIG. 6. In the search procedure of the latest vector search section 2a in FIG. 6, steps S11 to S17 are the same as those in the search procedure of the latest vector search section 2 in FIG. 3 and are denoted by the same reference symbols, and a detailed description thereof will be omitted. The respective components will be described below with reference to FIG. 5.

Initialization is performed in the same manner as in the first embodiment (steps S11 and S12). It is then checked whether the processing up to an index i="N" is completed (step S13). If the processing is completed, the resulting value is stored in the memory, and the search operation is ended (step S14). If the processing is not ended (NO in step S14), "1" is added to the index i of step S13 (step S15). The strain calculation necessity determining section 23 extracts the index i and an inter-vector distance $D_{i,min}$ corresponding to an index min from the code book inter-vector distance table 300 (step S16), and compares the inter-vector distance $D_{i,min}$ with an inter-vector distance $D_{min}$ stored in the memory 24 (step S17). If $D_{i,min} < 4\ D_{min}$ of inequality (2) is not satisfied, it is determined that strain calculation is rot necessary (NO in step S17), and an index i+1 corresponding to the next code book vector is supplied to the search order determining section 21, thus setting the next target code book vector. If it is determined that strain calculation is necessary, the index i is supplied to the strain calculating section 22.

Subsequently, "p" of a $J_{(p)}$th-degree component is set to be "1", and $J_{(0)}$ is set to be "1" (step S24). The strain calculating section 22 extracts a code book vector Yi from the code book 200 by using the index i, and calculates the strain between the code book vector Yi and the input vector X (step S25). If the difference as a strain is squared, a partial sum $S_{J(p)}$ from a low-degree component to the $J_{(p)}$th-degree component can be sequentially obtained according to the following equations:

$$S_{J(p)} = S_{J(p-1)} + \sum_{k=J_{(p-1)}+1}^{J_{(p)}} (X(k) - Y_i(k))^2 \tag{5}$$

This partial sum $S_{J(p)}$ is supplied to the strain calculation interruption determining section 25. The strain calculation interruption determining section 25 compares the partial sum $S_{J(p)}$ with the inter-vector distance $D_{min}$ stored in the memory 24 (step S26). If the following relation for comparison is satisfied:

$$S_{J(p)} > D_{min} \quad (6)$$

then, the strain calculation is interrupted. If the strain calculation is interrupted (YES in step S26), the index $i+1$ corresponding to the next code book vector is supplied to the search order determining section 21, thus setting the next target code book vector.

If the strain calculation is not interrupted (NO in step S26), the value p of the degree $J_{(p)}$ of the vector is incremented by one, and the resulting value is supplied to the strain calculating section 22.

It is checked whether the degree $J_{(p)}$ of the vector is equal to a vector dimension M (step S27). If the degree $J_{(p)}$ of the vector is equal to the vector dimension M (YES in sep S27), the partial sum $S_{J(p)}$ is stored, as a new minimum strain $D_{min}$, in the memory, and a new index min is supplied to the strain calculation necessity determining section 23 (step S28).

If the degree $J_{(p)}$ of the vector is less than the vector dimension M (NO in step S27), "1" is added to "p" of the degree $J_{(p)}$ of the vector (step S29). The flow then returns to step S25 to calculate the next partial sum $S_{J(p)}$ of strains.

The above-described operation is performed with respect to all the code book vectors in the same procedure as described above, thus searching for an optimal code book vector.

According to the third embodiment described above, the number of required strain calculations can be reduced, and the number of comparisons can reduced.

In addition, the incremental quantity of "p" need not be determined in accordance with a specific pattern but may be determined on the basis of the difference between the partial sum $S_{J(p)}$ and the minimum strain $D_{min}$ as follows. If the difference is large, the incremental quantity of "p" is set to be large to increase the number of elements to be added, thus quickly reducing the difference. If the difference is small, comparison is performed while the incremental quantity of "p" is set to be small. If such adaptive processing is employed, the numbers of strain calculations and comparisons can be reduced in a balanced manner. In addition, if the value "p" is incremented one by one, the same operation as in the first embodiment can be realized.

As described above, in the third embodiment, when the number of dimensions as a basis for the number of strain calculations is to be set, the number of dimensions which is present on the basis of a specific pattern is stored in the table, or the number of dimensions which is not limited by a specific pattern but is adaptively set in accordance with parameter changes (partial sum $S_{J(p)}$ and minimum strain $D_{min}$) is stored. In this case, since the number of dimensions is already set in the execution of strain calculation, the number of dimensions preset by one of the two types of setting methods described above is used as a preset number of dimensions.

The present invention is not limited to the above-described embodiments. For example, if the first, second, and third embodiments are used, the numbers of strain calculating sections, strain calculation necessity determining sections, and strain calculation interruption determining sections can be easily increased, and the processing speed can be increased in proportion to the numbers of components. In each embodiment described above, a network having a simple hierarchical structure in which input and output layers are connected to each other through an intermediate layer is used. However, a hierarchical network in which intra-layer coupling and feedback coupling are performed can be used.

FIG. 7 is a block diagram showing the arrangement of a high-speed vector quantization apparatus according to the fourth embodiment of the present invention. Similar to the first embodiment, the arrangement of this high-speed vector quantization apparatus is roughly divided into a code book generating section 1a and an optimal vector search section 2c.

In the code book generating section 1a, a training section 10 generates a code book 101 in accordance with a provided training sequence. A sort section 110 sorts the code book 101 into base values (individual vector component quantities) in units of components to form a sort table 201 and adds numbers corresponding to the base values to corresponding vector components in the code book 101.

The optimal vector search section 2c comprises: a component calculation order determining section 27 for determining a component calculation order by using average values in the sort table 201 upon reception of an input vector X; a strain calculating section 22 constituted by a dimensional strain calculating section 22a for calculating the strain between the input vector X and a code book vector in each dimension, and a partial strain calculating section 22b for calculating the partial sum of the strains; a lower limit calculating section 28 for obtaining the lower limit value of strain by using the sort table 201; a memory 24 for storing a partial strain amount, a lower limit value, and a minimum strain amount as an upper limit value; and a comparing section 29 for determining strain calculation interruption by using the upper limit value and the partial sum of strains, and for determining the end of search by using the upper and lower limit values.

The component calculation order determining section 27 forms a component calculation order table 301 by using component average values in the sort table 201 such that component calculation is performed in the order of decreasing differences between the component average values and a component of the input vector X.

FIGS. 8A and 8B respectively show formats of the code book 101 and the sort table 201.

Referring to FIG. 8A, the code book 101 is constituted by the component values and base value numbers of code book vectors, which are sorted in units of dimensions and numbers of code book vectors. Referring to FIG. 8B, the sort table 201 is constituted by base values and vector counts, which are sorted in units of base value numbers corresponding to the code book vectors, and dimensions.

Figure 8C:
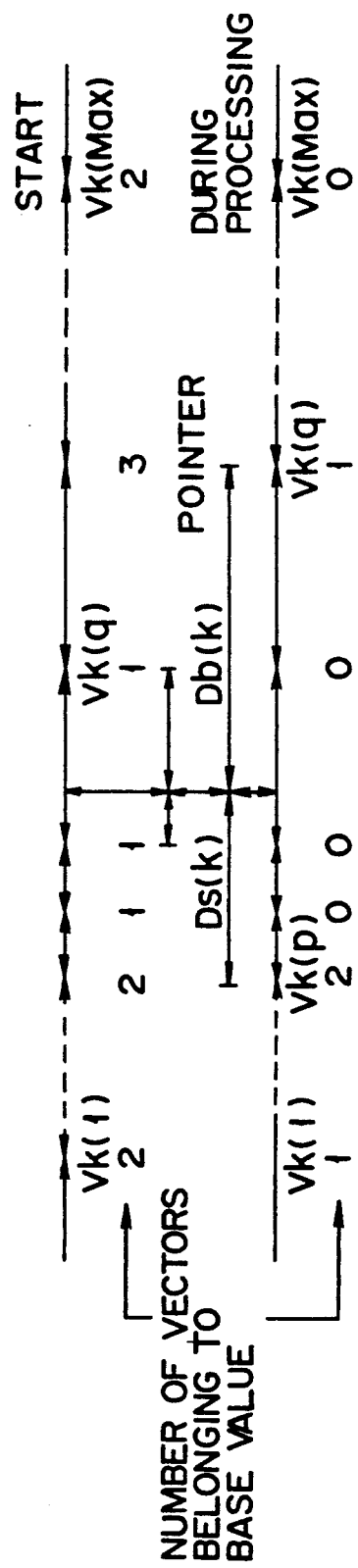
FIG. 8C is a view showing the movement of a pointer for indicating the base value (nearest base value) of a vector nearest to an input vector X in a given dimension.

Referring to FIG. 8C, when the kth-dimensional components of code book vectors are sorted into base values, the tth base value, counting from smaller numbers, is represented by "Vk(t)", and pointers indicating base values (nearest base values) nearest to the input vector X are represented by "p" and "q". In addition, the differences between the input vector X and the base values of code book vectors are respectively represented by Ds(k) and Db(k). The difference Ds(k) represents a difference on the side where the base value is smaller than input vector X.

An operation of the vector quantization apparatus of the fourth embodiment will be described below. In this case, assume that the number of code book vectors is represented by "N", the number of dimensions of a vector is represented by "M", and a code book vector indicated by an index i is represented by "Yi".

In the code book generating section 1a as a preprocessing section, the code book 101 and a sort table 201 are generated in accordance with a training sequence.

Figure 9:
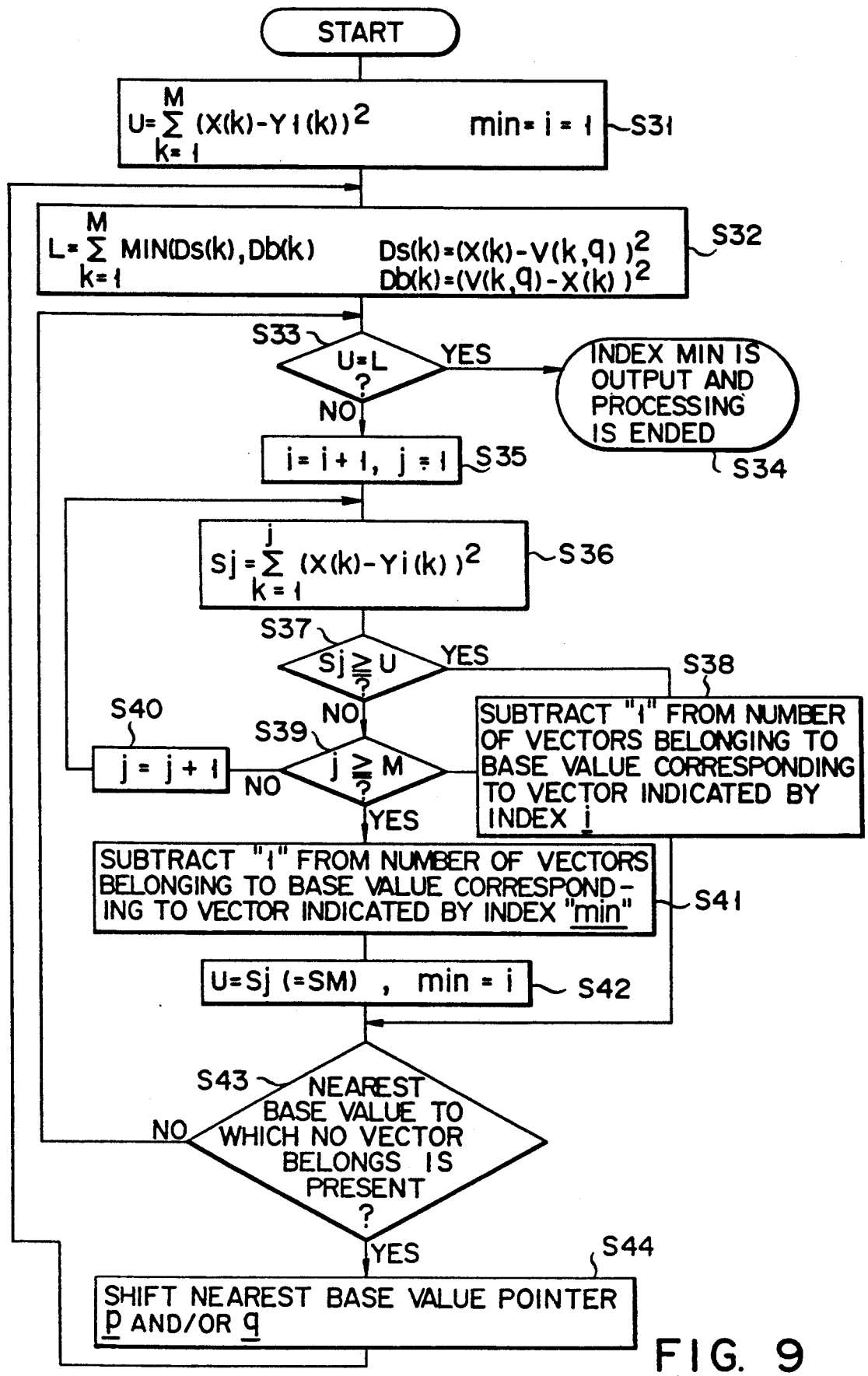
FIG. 9 is a flow chart showing a procedure in which an optimal vector search section searches for an optimal code book vector.

A flow chart in FIG. 9 shows a procedure in which the optimal vector search section 2c of the fourth embodiment searches for an optimal code book vector.

Upon reception of the input vector X, the component calculation order determining section 27 forms the component calculation order table 301 by using component average values in the sort table 201 such that component calculation is performed in the order of decreasing differences between the component average values and a component of the input vector X (for the sake of descriptive convenience, assume that the components are rearranged in the order of increasing dimensions such that a component providing the maximum difference is in the first dimension and a component providing the minimum difference is in the Mth dimension).

The strain calculating section 22 extracts a code book vector Y1 corresponding to an index 1 from the code book 101. The section 22 then calculates a sum U of strains between the code book vector Y1 and the input vector X in all dimensions according to the following equation:

$$U = \sum_{k=1}^{M} (X(k) - Y1(k))^2 \quad (7)$$

The section 22 stores an index min ("1" in this case) corresponding to the sum U in the memory 24 (step S31). That is, the sum U of the strains in all the dimensions is set as an upper limit value.

The lower limit calculating section 28 calculates square strains Ds(k) and Db(k) based on the input vector X and the base values of code book vectors by using the sort table 201 according to the following equations (7) and (8):

$$Ds(k) = (X(k) - Vk(p))^2 \quad (8)$$

$$Db(k) = (Vk(q) - X(k))^2 \quad (9)$$

where, as shown in FIG. 8C, k is the dimension of a vector, p and q are pointers indicating base values (nearest base values) nearest to the input vector X, and Ds is the difference on the side where the base value is smaller than the input vector X.

A lower limit value L is calculated according to the following equation:

$$L = \sum_{k=1}^{M} MIN(Ds(k), DB(k))$$

$$\text{for } MIN(a,b) = a (a < b)$$
$$b (a \geq b)$$

The calculated lower limit value L is then stored in the memory 24 (step S32).

Subsequently, the comparing section 29 compares the upper and lower limit values U and L stored in the memory 24 with each other (step S33).

If the upper and lower limit values U and L coincide with each other (YES in step S33), since the upper limit value U is the minimum strain with respect to all the code book vectors, the index min is output and the processing is ended (step S34).

If the upper and lower limit values U and L do not coincide with each other (NO in step S33), the index i is incremented to perform a comparison with respect to the next code book vector (step S35). That is, "1" is added to the index i. In this case, it is assumed that the jth-dimensional component is "1".

The strain calculating section 22 extracts the code book vector Yi from the code book 101 by using this index i, and calculates the strain between the code book vector Yi and the input vector X (step S36). In this case, a partial sum $S_j$ of strains between a lower-dimensional component and the jth-dimensional component according to the following equation:

$$S_j = \sum_{k=1}^{M} (X(k) - Yi(k))^2 \quad (11)$$

(j=1~M)

The calculated partial sum $S_j$ is supplied to the comparing section 29. The comparing section 29 compares the partial sum $S_j$ with the upper limit value U stored in the memory (step S37). If the following relation is satisfied (YES in step S37):

$$S_j \geq U \quad (12)$$

then, the strain calculation is interrupted.

If the strain calculation can be interrupted, the index i+1 corresponding to the next code book vector is supplied to the strain calculating section 22 to set the next target code book vector. Since the vector indicated by the index i does not provide the minimum strain (upper limit value U), the number of vectors belonging to a base value corresponding to this vector is decreased by one (step S38), and the flow advances to step S43 (to be described later).

If the strain calculation cannot be interrupted (NO in step S37), the degree j of the vector is compared with the dimension M (step S39).

If the degree of the vector is smaller than the dimension M (NO in step S39) "1" is added to the degree j (step S40), and the flow returns to step S36. That is, "j+1" is supplied to the strain calculating section 22 (step S40).

If the degree j of the vector is equal to the dimension M and the partial sum $S_j$ is smaller than the minimum strain (YES in step S39), since it is apparent that the vector indicated by the index min does not provide the minimum strain, the number of vectors belonging to the base value corresponding to this vector is decreased by one (step S41).

This minimum strain is stored, as a new upper limit value U, in &he memory 24, and the index i at this time is stored, as a new index min, in the memory 24 (step S42).

As the number of vectors belonging to a base value corresponding to code book vectors which are determined as code book vectors which do not provide the minimum strain is decreased by one, it is checked whether there is a latest nearest base value to which no vector belongs (step S43). In this case, if there is a nearest base value "0" (YES in step S43), the corresponding nearest base value pointer "p" or "q" is shifted to a base value at which the belonging vector is present (step S44), and the lower limit value L is returned to step S32 to perform a calculation again.

If the number of vectors belonging to the nearest base value is not "0", the processing subsequent to step S33 is continued while the lower limit value L is kept unchanged. Such processing is repeatedly performed in accordance with this procedure until the upper and lower limit values U and L coincide with each other.

With the above-described operation, the same optimal solution as that obtained by searching all the code book vectors can be obtained, and a search operation can be interrupted. Furthermore, since strain calculations with respect to components are performed in the order of decreasing probabilities of large strains, the maximum strain is obtained with the minimum number of calculations, thus allowing interruption of strain calculation with a small number of calculations. With this operation, an optimal code book code corresponding to an input vector can be efficiently obtained with a small number of calculations. In addition, since the strains between nearest base values and input vector components can be independently calculated in units of components by the lower limit calculating section 28, the processing speed can be further increased by processing the calculated strains in parallel.

Figure 10:
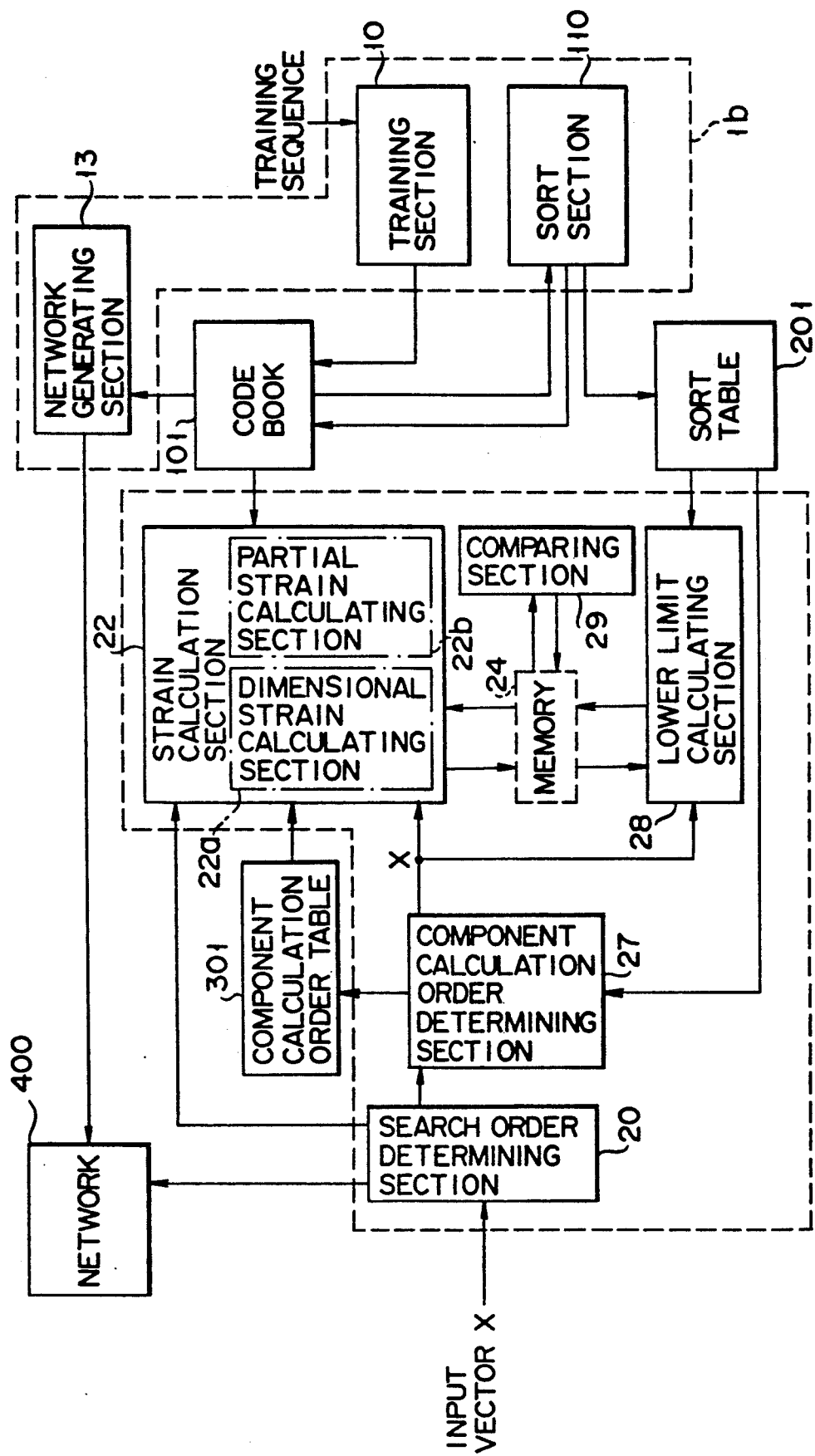
FIG. 10 is a block diagram showing the arrangement of a vector quantization apparatus according to the fifth embodiment of the present invention.

FIG. 10 shows the arrangement of a vector quantization apparatus according to the fifth embodiment of the present invention. Similar to the fourth embodiment, this apparatus is constituted by a code book generating section 1b and an optimal vector search section 2d.

This code book generating section 1b includes a network generating section 13 in addition to the training section 10 and the sort section 110 in the fourth embodiment. The network generating section 13 generates a network 400 for receiving a vector and outputting an index corresponding to the vector. The optimal vector search section 2d includes a search order determining section 20 in addition to the component calculation order determining section 27, the strain calculating section 22, the lower limit calculating section 28, the memory 24, and the comparing section 29 in the fourth embodiment. The search order determining section 20 receives an input vector X and determines a search order with respect to the code book 101 by using the network 400.

An operation of the apparatus having such an arrangement will be described next.

In the fifth embodiment, the network 400 is generated by the network generating section 13 in the code book generating section 1b in accordance with the same procedure as that in the first embodiment, and hence a description of the procedure will be omitted.

After the network 400 is generated by the network generating section 13, the input vector X is input to the search order determining section 20 in the optimal vector search section 2d as an encoding section. In the search order determining section 20, the indexes of the network 400, which has undergone a learning process by means of code book vectors, are rearranged such that a search operation is performed in the order of decreasing ignition amounts (output amounts) of the output units. In accordance with this order, the processing shown in the flow chart in FIG. 9 is performed in the same manner as in the fourth embodiment.

In the fifth embodiment, strain calculation can be started from a code book vector nearest to an input vector regardless of the distribution of code book vectors. Therefore, strain calculation for most of the remaining code book vectors need not be performed, or even if strain calculation is required, the calculation processing can be interrupted with a small number of calculations.

With this operation, the number of calculations required to obtain an optimal code book vector with respect to an input vector can be greatly reduced. In this embodiment, square strains are used for strain calculation. However, other types of strains can be used.

As has been described in detail above, according to the present invention, a code book vector nearest to an input vector is selected and strain calculation is started from the code book vector corresponding to the input vector regardless of the type of the input vector, thereby providing a vector quantization method and apparatus which can efficiently perform a search operation at high speed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A vector quantization method comprising the steps of:
    generating a network for performing a learning operation on the basis of a code book, in which specific representative vectors respectively having indexes assigned thereto are stored, such that output units for outputting in accordance with indexes of code book vectors Yi are caused to output larger outputs as said output units are located nearer to an input vector input to one of said output units;
    causing said output units to output in accordance with an input vector X input to said network, and determining a search order to search the code book vectors Yi in the order of the indexes corresponding to decreasing change amounts in output;
    performing strain calculation by sequentially calculating strains between the code book vectors Yi selected in the search order and the input vector X in units of dimensions;
    comparing a partial sum of strains obtained by the strain calculation step with a minimum strain; and
    interrupting the strain calculation when the partial sum becomes larger than the minimum strain.

2. A method according to claim 1, wherein:
    the step of performing strain calculation comprises the steps of performing initialization by calculating a strain between a first code book vector Y1 and the input vector X and setting the calculated strain as a minimum strain, and calculating a partial sum of strains by calculating strains between the second and subsequent code book vectors Yi and the input vector X in units of dimensions, and
    the comparing step comprises the steps of comparing the partial sum in each dimension with the minimum strain, and, when the partial sum through the dimensions becomes smaller than the minimum strain, setting the total sum as a new minimum strain.

3. A vector quantization method according to claim 1, comprising the steps of:
    calculating absolute values of differences between the average values of code book vectors in the respective dimensions and the input vector in units of dimensions; and setting a selection order in the steps of calculating the partial sum of strains such that calculation target components are selected in the order in which the absolute values of said differences are decreased.

4. A vector quantization apparatus comprising:

network generating means for generating a network for performing a learning operation such that output units corresponding to indexes of a plurality of code book vectors Yi have separation capabilities to output larger outputs as code book vectors corresponding to said output units are located nearer to an external input vector X;

search order determining means for causing said output units to output in accordance with the input vector X input to said network generating means, and determining a search order to search code book vectors in the order of the indexes corresponding to decreasing change amounts in output;

strain calculating means for sequentially calculating strains between the code book vectors Yi selected in the search order and the input vector X in units of dimensions;

comparing means for comparing a partial sum of strains obtained by said strain calculating means with a minimum strain; and strain calculation interrupting means for interrupting the strain calculation when the partial sum becomes larger than the minimum strain.

5. An apparatus according to claim 4, wherein said strain calculating means comprises means for performing initialization by calculating a strain between a first code book vector Y1 and the input vector X and setting the calculated strain as a minimum strain, and means for calculating a partial sum of strains by calculating strains between a second and subsequent code book vectors Yi and the input vector X in units of dimensions, and said comparing means comprises means for comparing the partial sum in each dimension with the minimum strain, and when the partial sum through the dimensions becomes smaller than the minimum strain, setting the total sum as a new minimum strain.

6. A vector quantization apparatus according to claim 4, comprising:

average value calculating means for calculating average values of vectors constituting a code book in units of dimensions;

difference calculating means for obtaining absolute values of differences between the average values obtained by said average value calculating means and the input vector in units of dimensions; and calculation order determining means for determining a calculation order to calculate strains in the order in which the absolute values of the differences obtained by said difference calculating means are decreased.

7. A vector quantization method comprising the steps of:

generating a network for performing a learning operation on the basis of a code book, in which specific representative vectors respectively having indexes assigned thereto are stored, such that output units for outputting in accordance with indexes of code book vectors Yi are caused to output larger outputs as said output units are located nearer to an input vector input to one of said output units;

causing said output units to output in accordance with an input vector X input to said network, and determining a search order to search the code book vectors Yi in the order of the indexes corresponding to decreasing change amounts in output;

performing strain calculation by sequentially calculating strains between the code book vectors Yi selected in the search order and the input vector X in units of dimensions designated in advance;

comparing a partial sum of strains obtained by the strain calculation step with a minimum strain; and interrupting the strain calculation when the partial sum becomes larger than the minimum strain.

8. A vector quantization method according to claim 7, comprising the steps of:

calculating absolute values of differences between the average values of code book vectors in the respective dimensions and the input vector in units of dimensions; and setting a selection order in the steps of calculating the partial sum of strains such that calculation target components are selected in the order in which the absolute values of said differences are decreased.

9. A vector quantization apparatus comprising:

network generating means for generating a network for performing a learning operation such that output units corresponding to indexes of a plurality of code book vectors Yi have separation capabilities to output larger outputs as code book vectors corresponding to said output units are located nearer to an external input vector X;

search order determining means for causing said output units to output in accordance with the input vector X input to said network generating means, and determining a search order to search code book vectors in the order of the indexes corresponding to decreasing change amounts in output;

an index increment table for indicating a present number of dimensions, and storing an index with which strain calculation interruption is to be executed;

strain calculating means for sequentially calculating strains between the code book vectors Yi selected in the search order and the input vector X in units of dimensions preset by said index increment table;

comparing means for comparing a partial sum of strains obtained by said strain calculating means with a minimum strain; and strain calculation interrupting means for interrupting the strain calculation when the partial sum becomes larger than the minimum strain.

10. A vector quantization apparatus according to claim 9, comprising:

average value calculating means for calculating average values of vectors constituting a code book in units of dimensions;

difference calculating means for obtaining absolute values of differences between the average values obtained by said average value calculating means and the input vector in units of dimensions; and calculation order determining means for determining a calculation order to calculate strains in the order in which the absolute values of the differences obtained by said difference calculating means are decreased.

11. A vector quantization method comprising the steps of:

setting a minimum strain as an upper limit value, the minimum strain being obtained within a completed search operation by comparison between an input vector and code book vectors;

setting a sum of minimum strains as a lower limit value, the minimum strains being calculated between base values belonging to at least one of a code book vector providing a minimum strain and code book vectors which are not searched yet, and base values belonging to the input vector, in units of dimensions;

performing a storing/comparing operation by storing and comparing the lower and upper limit values;

performing a search terminating operation by terminating a search operation when the upper and lower limit values are compared and coincide with each other in the storing/comparing operation;

calculating a partial sum of strains between code book vectors up to a predetermined dimensional component and the input vector in units of dimensions when the search operation is not terminated in the search terminating operation;

comparing the partial sum with the upper limit, and interrupting the strain calculation when the partial sum is not less than the upper limit value; and performing an upper limit value updating operation, when the partial sum through the dimensions is smaller than the upper limit, by setting the total sum as a new upper limit value.

12. A method according to claim 11, further comprising the step of calculating absolute values of differences between average values of code book vectors in the respective dimensions and the input vector in units of dimensions, and setting a selection order in the step of calculating the partial sum of strains such that calculation target components are selected in the order in which the absolute values of the differences are decreased.

13. A vector quantization apparatus comprising:

upper limit value setting means for setting a minimum strain as an upper limit value, the minimum strain being obtained within a completed search operation by comparison between an input vector and code book vectors;

sort means for sorting vectors, which constitute a code book and comprise components in a plurality of dimensions, into individual component values as base values in units of dimensions;

lower limit value setting means for calculating a sum of strains through the dimensions between base values belonging to at least one of a code book vector providing a minimum strain and code book vectors which are not searched yet, and base values belonging to the input vector in units of dimensions;

storing/comparing means for storing and comparing the lower and upper limit values;

search terminating means for terminating a search operation when the upper and lower limit values are compared by said storing/comparing means and coincide with each other;

a partial strain sum calculating means for calculating a partial sum of strains between code book vectors up to a predetermined dimensional component and the input vector in units of dimensions when the search operation is not terminated by said search terminating means;

strain calculating interrupting means for comparing the partial sum with the upper limit, and interrupting the strain calculation when the partial sum is not less than the upper limit value; and upper limit value updating means for performing an upper limit value updating operation, when the partial sum through the dimensions is smaller than the upper limit, by setting the total sum as a new upper limit value.

14. A vector quantization apparatus according to claim 13, comprising:

average value calculating means for calculating average values of vectors constituting a code book in units of dimensions;

difference calculating means for obtaining absolute values of differences between the average values obtained by said average value calculating means and the input vector in units of dimensions; and calculating order determining means for determining a calculation order to calculate strains in the order in which the absolute values of the differences obtained by said difference calculating means are decreased.

* * * * *